(12) United States Patent
Hwang

(10) Patent No.: US 7,655,545 B2
(45) Date of Patent: Feb. 2, 2010

(54) IMAGE SENSOR AND METHOD OF FABRICATING THE SAME

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/004,687

(22) Filed: Dec. 20, 2007

(65) Prior Publication Data
US 2008/0157249 A1 Jul. 3, 2008

(30) Foreign Application Priority Data
Dec. 28, 2006 (KR) .................. 10-2006-0136251

(51) Int. Cl.
*H01L 21/00* (2006.01)
(52) U.S. Cl. ................. 438/514; 257/E27.134
(58) Field of Classification Search ............ 257/E21.04, 257/E27.134; 438/69, 514, 519, 527, 546, 438/547, 548, 549, 59, 423; 348/308
See application file for complete search history.

(56) References Cited

U.S. PATENT DOCUMENTS

| 6,914,314 | B2 * | 7/2005 | Merrill et al. | ........... 257/440 |
| 6,946,715 | B2 | 9/2005 | Hong | |
| 7,110,028 | B1 | 9/2006 | Merrill | |
| 7,271,025 | B2 * | 9/2007 | Mouli | ............ 438/59 |
| 2004/0161868 | A1 | 8/2004 | Hong | |
| 2004/0232314 | A1 | 11/2004 | Hong | |

FOREIGN PATENT DOCUMENTS

KR     10-2005-0098958     10/2005

OTHER PUBLICATIONS

Sung Kwon Chris Hong; CMOS Image Sensor and Method of Fabrication; esp@cenet database: Publication No. KR20050098958; Publication Date: Oct. 12, 2005; esp@cenet database Worldwide.
Office Action for Korean Application No. 10-2006-0136251; Dated: Dec. 18, 2007; 4 Pages.

* cited by examiner

*Primary Examiner*—Davienne Monbleau
*Assistant Examiner*—Hoa B Trinh
(74) *Attorney, Agent, or Firm*—The Law Offices of Andrew D. Fortney; Andrew D. Fortney

(57) ABSTRACT

An image sensor includes a first photodiode formed in a semiconductor substrate at a depth reachable by red light, a second photodiode disposed on or over the first photodiode in the semiconductor substrate at a depth reachable by blue light, a third photodiode disposed adjacent to the second photodiode, a plug connected to the first photodiode, transistor structures on the semiconductor substrate and electrically connected with the first, second and third diodes, an insulating layer covering the transistor structures, and microlenses on the insulating layer.

18 Claims, 5 Drawing Sheets

IMAGE SENSOR AND METHOD OF FABRICATING THE SAME

The present application claims priority under 35 U.S.C.119 and 35 U.S.C. 365 to Korean Patent Application No.10-2006-0136251 (filed on Dec. 28, 2006), which is hereby incorporated by reference in its entirety.

BACKGROUND

Embodiments of the invention relate to an image sensor and a method of fabricating the same.

Image sensors are semiconductor devices for converting optical images into electrical signals, and are mainly divided into a charge coupled device (CCD) image sensor and a complementary metal oxide semiconductor (CMOS) image sensor. The CCD is a kind of semiconductor device in which metal/oxide/silicon (MOS) capacitors are positioned closely to each other and charge carriers are stored in the capacitors and transferred. The CMOS image sensor employs a switching mode to detect an output of a photo detector using MOS transistors corresponding to the number of pixels, which areprovided through a CMOS technology that uses peripheral devices,such as a control circuit and a signal processing circuit.

In the CMOS image sensor, a color filter layer is formed on a pixel array so as to selectively transfer light having a specific wavelength to a photodiode, thereby realizing an image.

However, in the above method of realizing the image, pixels for realizing a single color can take a wide area. For instance, an image sensor including red, green and blue (RGB) color filters (which process natural light according to three main colors) requires three pixels for detecting a red color, a green color and a blue color. Accordingly, a technique for improving there solution of the image sensor made by the above method is desired.

SUMMARY

Embodiments of the invention provide an image sensor suitable for realizing a high-resolution image and a method of fabricating the image sensor.

An exemplary image sensor according to various embodiments comprises a first photodiode in a semiconductor substrate at a depth for detecting red light, a second photodiode over the first photodiode (preferably having a depth for detecting blue light), a third photodiode adjacent to the second photodiode,a plug in electrical contact with the first photodiode, transistor structures on the semiconductor substrate and electrically connected with the first, second and third photodiodes, an insulating layer covering the transistor structures, and amicro-lens on the insulating layer.

A method of fabricating an image sensor according to embodiments of the invention comprises the steps of implanting first impurities into a semiconductor substrate with an implantation depth configured to detect red light, implanting second impurities into a first predetermined region of the substrate with an implantation depth configured to detect blue light, implanting third impurities into a second predetermined region of the substrate adjacent to the first predetermined region,forming a plug in electrical contact with the first implanted impurities, forming transistor structures on the semiconductor substrate such that the transistor structures are electrically connected with the first implanted impurities and the first and second predetermined regions, forming an insulating layer coveringthe transistor structures, and forming a micro-lens on the insulating layer.

DETAILED DESCRIPTION OF THE EMBODIMENTS

Here in after, an image sensor and a method of fabricating the same according to the embodiments will be described in detail with reference to accompanying drawings.

Figure 1:
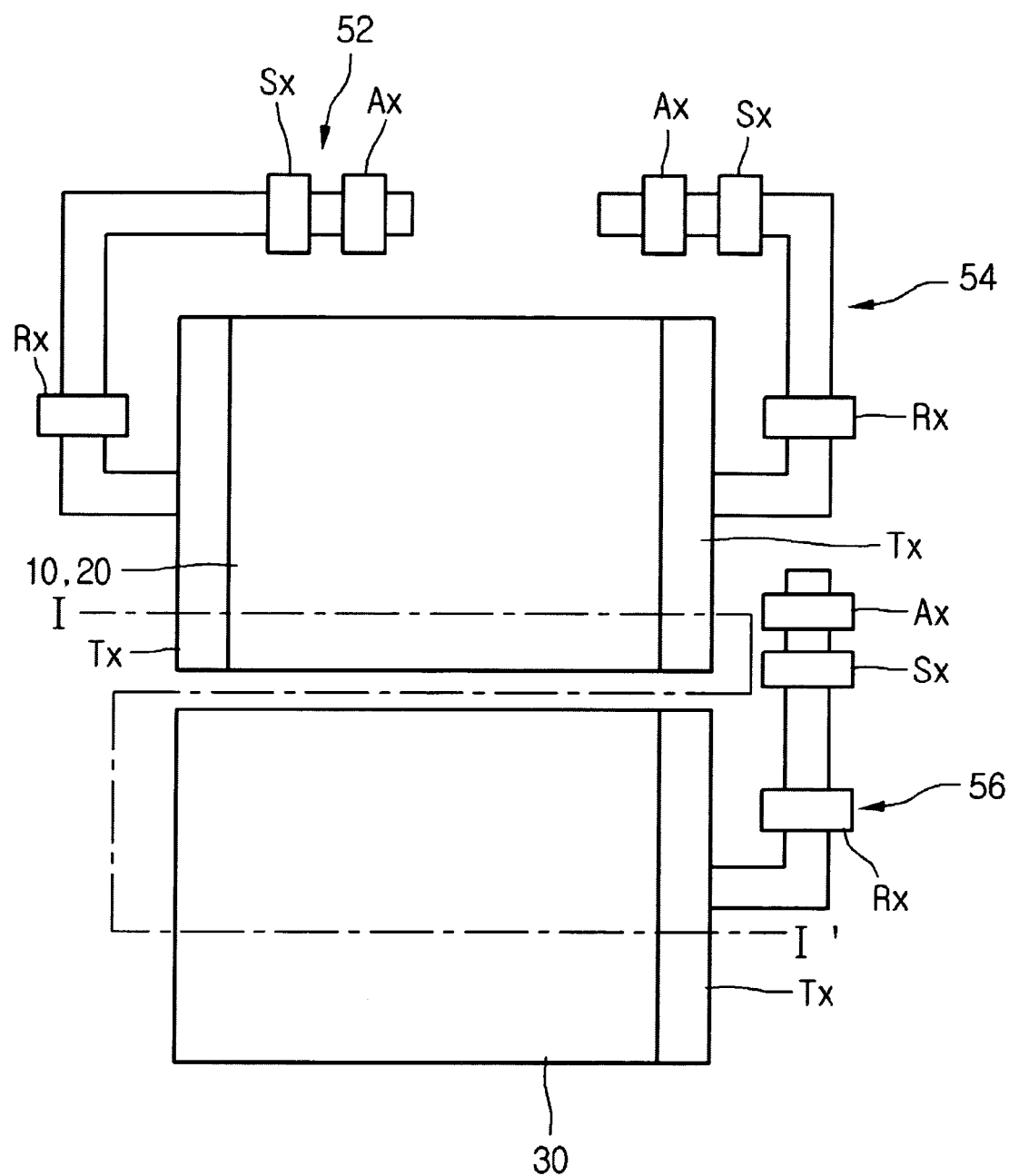
FIG. 1 is a plan view representing an image sensor according to an exemplary embodiment.
Figure 2A:
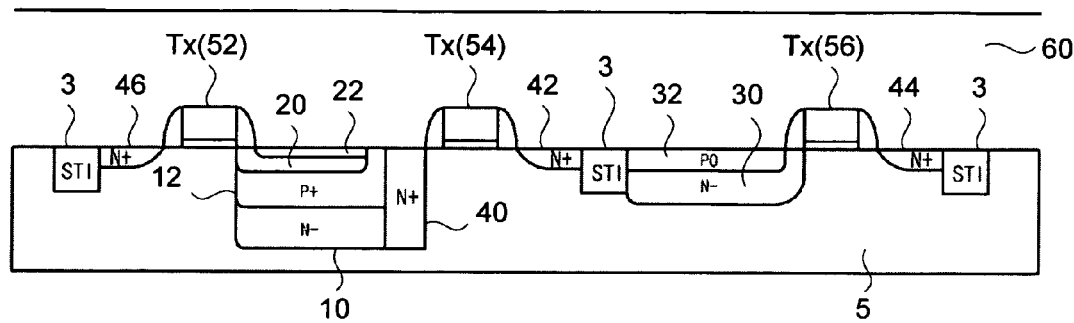
FIGS. 2A-2B are cross-sectional views of alternative embodiments, taken along line I-I' of FIG. 1.

FIG. 1 is a plan view representing an image sensor according to an embodiment, and FIG. 2A is a sectional view taken along line I-I' of in FIG. 1.

Figure 2B:
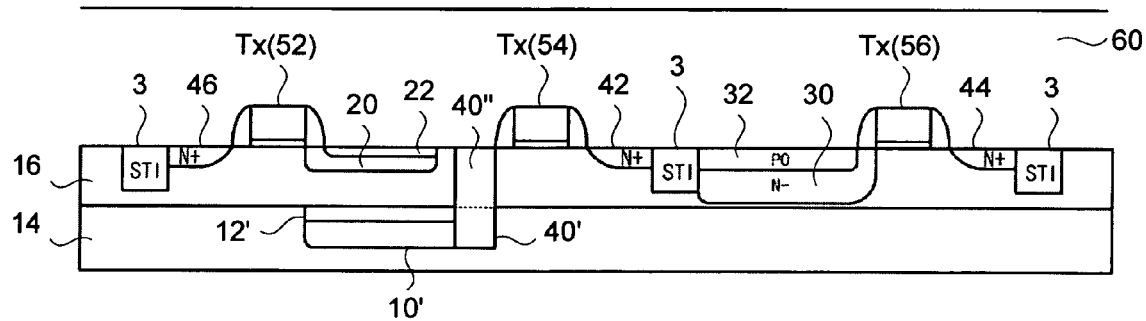

Referring to FIGS. 1 to 2A, an image sensor 100 includes a semiconductor substrate 5, a first photodiode 10 (e.g., for detecting red light), a second photodiode 20 (e.g., for detecting blue light), a third photodiode 30 (e.g., for detecting green light),a plug 40, transistor regions 52, 54 and 56 (each of which includes a plurality of gates Tx, Rx, Sx and Ax), and an insulating layer 60. Alternatively, the first through third photodiodes may be configured to detect yellow, cyan and magenta light.

The first photodiode 10, the second photodiode 20 andthe third photodiode 30 are disposed on the semiconductor substrate5, and the semiconductor substrate 5 has an isolation pattern 3. In the present embodiment(s), the first photodiode 10 (or, alternatively, an interface between N− implant layer 10 and P+ implant layer 12) is formed in the semiconductor substrate 5 ata depth corresponding to a reachable distance of light having ared wavelength. Thus, the first photodiode 10 may be configured to detect red light. In the exemplary embodiment(s), the first photodiode 10 has a depth (e.g., from the uppermost surface of the semiconductor substrate 5) of from about 0.7 μm to about 1.5 μm.

In one embodiment, the first photodiode 10 is formed directly in the semiconductor substrate 5 through an ion implantation process, without using an epitaxial layer. The second photodiode 20 is, for example, disposed on the semiconductor substrate 5. In an exemplary embodiment, the second photodiode 20 is in line with (e.g., over) the first photodiode 10 in the longitudinal direction, but there is a height (or depth) difference between the second photodiode 20 and the first photodiode 10. The second photodiode 20 (or, alternatively, an interface between N− implant layer 20 and P+ implant layer 22) may be formed at a depth in the semiconductor substrate a reachable distance by light having a blue wavelength. In other words, the second photodiode 20 maybe configured to detect blue light. In one exemplary embodiment,the second photodiode 20 is formed in the semiconductor substrate 5 at a depth (e.g., as measured from the surface of the semiconductor substrate 5) of from about 0.3 μm to about 0.5 μm. In another embodiment, the second photodiode 20 is formed on or in the semiconductor substrate 5 by ion implantation without using an epitaxial layer.

The third photodiode 30 is disposed on the semiconductor substrate 5. In an exemplary embodiment, the third photodiode 30 is disposed in a position adjacent to the second photodiode 20. In the present embodiment, the third photodiode 30 is formed at a depth (e.g., as measured from the surface of the semiconductor substrate 5) of from about 0.5 µm to about 1.5 µm. In one exemplary embodiment, the third photodiode 30 (or, alternatively, an interface between N− implant layer 30 and P+ implant layer 32) maybe configured to detect green light.

In yet another embodiment, the third photodiode 30 is formed on or in the semiconductor substrate 5 by ion implantation, without using an epitaxial layer.

In one exemplary embodiment, since the second photodiode 20 and the third photodiode 30 are disposed near the surface of the semiconductor substrate 5, the second photodiode 20 and the third photodiode 30 are electrically connected to a transistor region without using an additional connecting device. However, the first photodiode 10 is relatively deep in the semiconductor substrate 5, so that it is not easy to directly connect the first photodiode 20 with the transistor region. In an exemplary embodiment, a plug 40 is used to connect the first photodiode 10 with the corresponding transistor region. The plug 40 may be formed by implanting impurities at a high density and at a high energy into a region of the substrate 5 corresponding to the first photodiode 10.

Referring again to FIG. 1, the first photodiode 10, the second photodiode 20 and the third photodiode 30 are electrically connected with the transistor regions 52, 54 and 56, respectively. The transistor regions 52, 54 and 56 may include a transfer transistor Tx, a reset transistor Rx, a select transistor Sx and an (optional) access transistor Ax. The transfer and reset transistors Tx and Rx are connected to each of the first, second and third photodiode 10, 20 and 30 in series. The "source" of the transfer transistor Tx (to the extent it exists) is connected to the first, second and third photodiodes 10, 20 and 30, respectively. Drains of the transfer transistors Tx are also (or are connected to) sources of the corresponding reset transistors Rx, to form a floating diffusion region, a voltage or charge on which is coupled to the gate of the corresponding select transistor to drive an output of the pixel. A power supply voltage (Vdd) or other fixed voltage may be applied to drains of the rest transistors Rx.

The drain of the transfer transistor Tx serves as a floating diffusion (FD). The FD is connected to a gate of the select transistor Sx. The select transistor Sx is connected to the access transistor Ax in series. That is, a source of the select transistor Sx is (or is connected to) a drain of the access transistor Ax. The power supply voltage (e.g., Vdd) is applied to the drain of the access transistor Ax and the source of the reset transistor Rx. A drain of the select transistor Sx corresponds to an output terminal Out of the pixel, and a reset signal is periodically applied to the gate of the reset transistor Rx to reset the voltage or charge on the floating diffusion to a predetermined level.

Referring again to FIG. 2A, an insulating layer 60 covers the transistor structures 52, 54 and 56, thereby completing fabrication of the image sensor 100.

In an alternative embodiment, the second and third photodiodes 20 and 30 may be formed in an epitaxial (silicon) layer 16. In such an embodiment, the first photodiode 10' (e.g., N− implant 10' and P+ implant 12') can be formed at or near a surface of a single-crystal silicon substrate 14. However, plug 40 comprises first N+ portion 40' formed by ion implantation into substrate 14, and second N+ portion 40" in electrical contact with first N+ portion 40', formed by ion implantation into an entire thickness of the epitaxial (silicon) layer 16.

FIGS. 3 to 6 are sectional views representing a method of fabricating an image sensor according to the embodiment.

Figure 3:
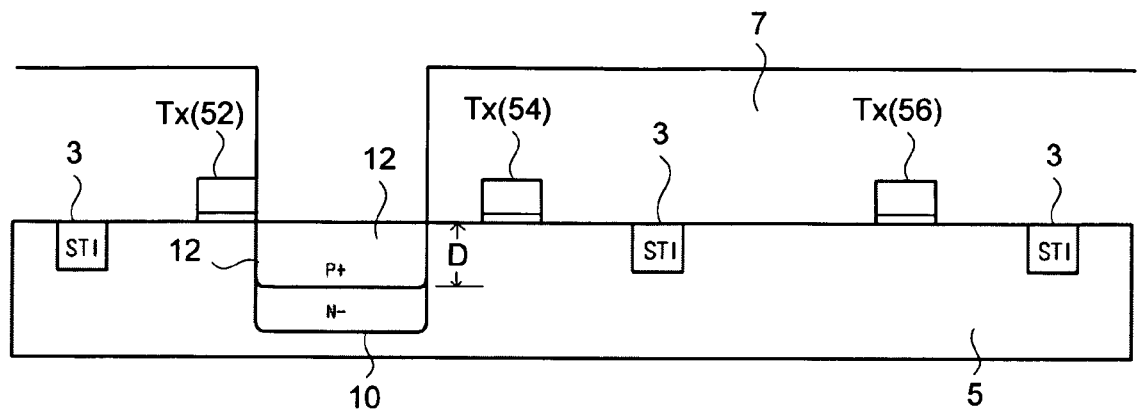
FIGS. 3 to 7 are cross-sectional views representing amethod of fabricating an image sensor according to exemplary embodiments of the invention.

Referring to FIG. 3, isolation regions 3 and transistor gates (e.g., Tx) in each region 52, 54 and 56 are formed by conventional techniques on substrate 5, then an ion implantation mask 7 having an opening is formed on the semiconductor substrate 5 (e.g., by conventional photolithographic patterning and development). Impurities (e.g., N-type ions, in a relatively low dose) are implanted with a first ion implantation energy through the ion implantation mask 7, to form the first photodiode layer 10 in the semiconductor substrate 5. Thereafter, complementary impurities (e.g., P-type ions, in a relatively high dose) are implanted with a second energy less than the first ion implantation energy through the ion implantation mask 7, to form the first photodiode layer 12 and a resultant P-N interface at a depth (or first distance) D in the semiconductor substrate 5. In an exemplary embodiment, the first distance D is in a range of from about 0.7 µm to about 1.5 µm.

Figure 4:
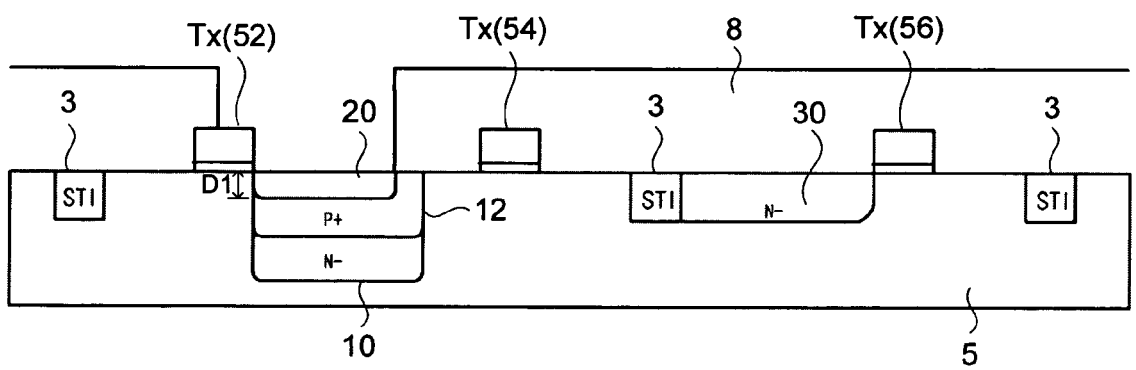

Referring to FIG. 4, after the first photodiode 10 has been formed, an ion implantation mask (not shown) having an opening is formed on the semiconductor substrate 5 (e.g., by conventional photolithographic patterning and development), and impurity ions (e.g., N-type ions, in a relatively low dose) are implanted with a third ion implantation energy less than the first ion implantation energy through the ion implantation mask to form the third photodiode layer 30. Then, an ion implantation mask 8 having an opening is formed on the semiconductor substrate 5 (e.g., by conventional photolithographic patterning and development). The opening of the ion implantation mask 8 is formed on a region substantially corresponding to the second photodiode 20. The impurities (e.g., N-type ions, in a relatively low dose) are implanted through the opening of the ion implantation mask 8 with a fourth ion implantation energy lower than the first and/or second ion implantation energies, so that the impurities penetrate into the surface of the semiconductor substrate 5 by a second distance D1 shorter than the first distance D. In the present embodiment, the second distance D1 is in a range of about 0.3 µm to about 0.5 µm.

In the exemplary embodiment(s), a high density impurity region (e.g., P+ region 12) can be formed between the first photodiode 10 and the second photodiode 20 so as to prevent the first photodiode 10 and the second photodiode 20 from interfering with each other.

Figure 5:
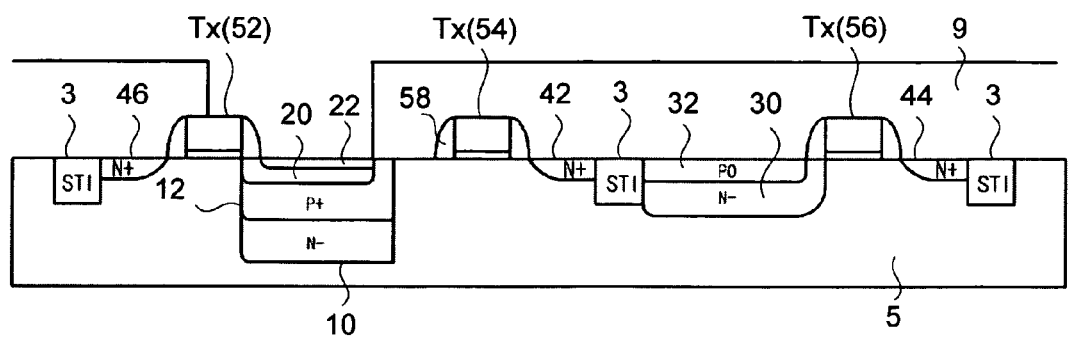

Referring to FIG. 5, after forming the second photodiode-layer 20, insulating sidewall spacers 58 (e.g., comprising an oxide, nitride, or nitride-on-oxide bilayer) are conventionally formed on the substrate 5, and complementary impurities (e.g., P-type ions, in a relatively high dose) are implanted with a sixth energy less than the second ion implantation energy through an ion implantation mask (not shown) to form the third photodiode layer 32 and a resultant P-N interface, thereby forming the third photodiode 30. Thereafter, an ion implantation mask 9 having an opening is formed on the semiconductor substrate 5 so as to form the second photodiode 20. In the exemplary embodiment(s), the opening of the ion implantation mask 9 is formed in a region substantially adjacent to the third photodiode 30 and over the first photodiode 10. The impurities (e.g., P-type ions, in a relatively high dose) are implanted into the semiconductor substrate 5 through the opening of the ion implantation mask 9, so that the second photodiode layer 22 is formed, thereby forming a resultant P-N interface and the second photodiode 20. In exemplary embodiments, the third photodiode 30 is formed in the semiconductor substrate at a depth (or position away from the surface of the semiconductor substrate 5) of from 0.5 µm to 1.5 µm.

Figure 6:
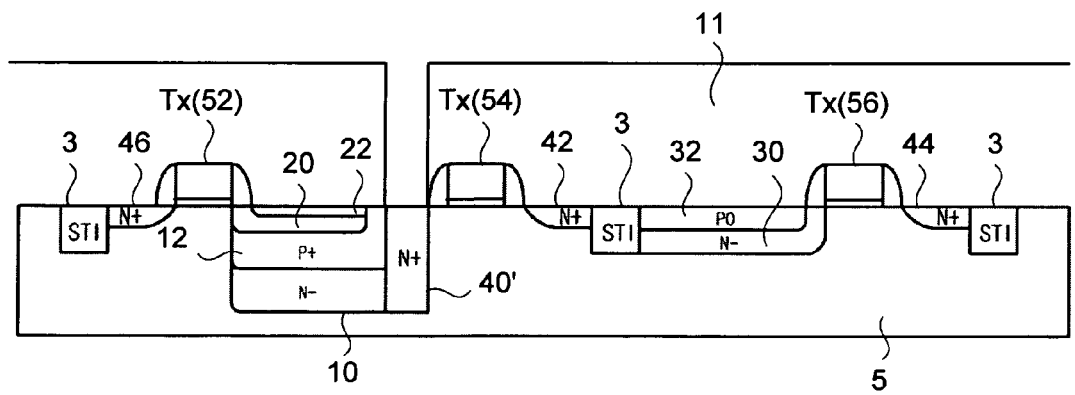

Referring to FIG. 6, after forming the first, second and third photodiodes 10, 20 and 30 on the semiconductor substrate 5, a high energy and high density ion implantation (e.g., using N-type ions, such as P, As or Sb) is performed (e.g., using photoresist mask 11) in a region corresponding to a portion of the first photodiode 10, to form a plug 40 in electrical contact with the first photodiode 10.

Subsequently, as shown in FIG. 2A, the insulating layer 60 covering the transistor regions 52, 54 and 56 is formed, there by completing the process of manufacturing the image sensor 110.

Figure 7:
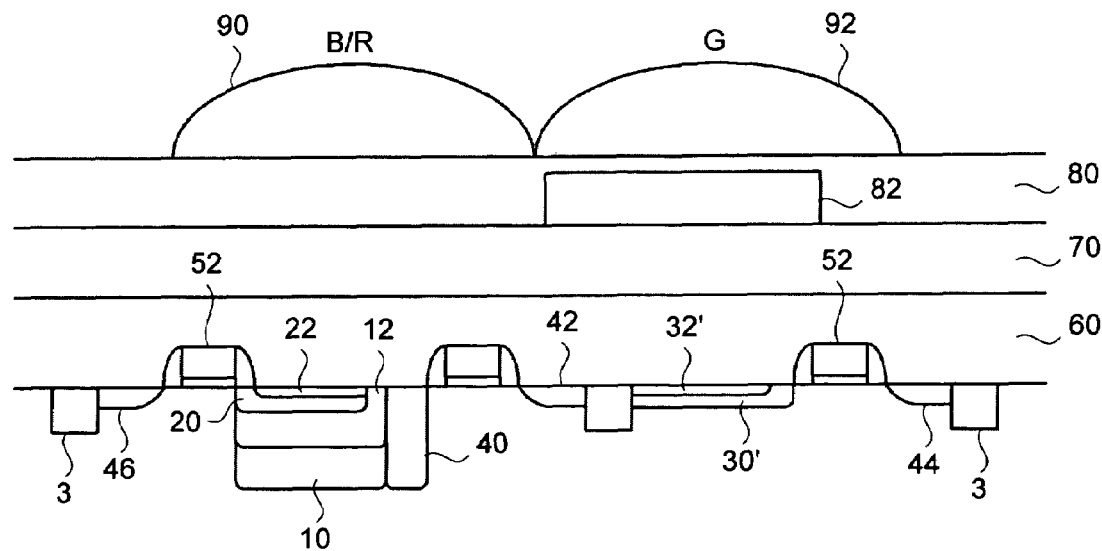

FIG. 7 shows a further embedment in which a interlayer dielectric (ILD) layer 70 is formed on (premetal) dielectric layer 60, then a color filter 82 (e.g., a green color filter) is formed on the ILD layer 70 (generally by conventional photolithographic patterning and development of a green color filter material) in a location corresponding to the second photodiode 30'. There after a planarization layer 80 is formed over the color filter 82, and microlenses 90 and 92 (corresponding to the first/second photodiodes 10/20 and the third photodiode 30, respectively) are formed on the planarization layer 80. In such an embodiment, N− implants 20 and 30 can be formed at the same time (e.g., using the same mask), and P+ implants 22 and 32 can be formed at the same time (e.g., using the same mask), thereby reducing the total number of masks in the process by one.

Figure 8:
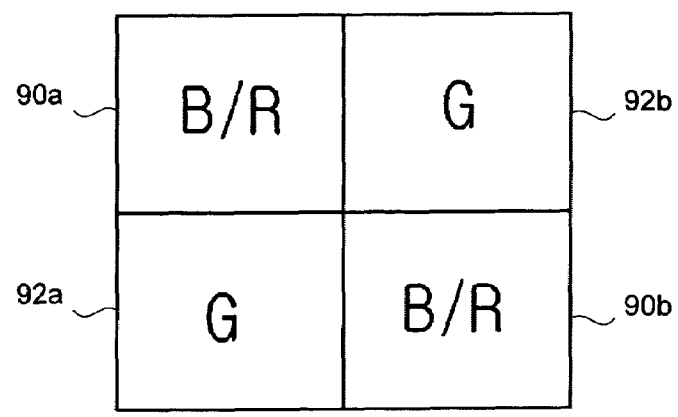
FIG. 8 is a layout view showing an exemplary layout pattern for the pixel regions of an exemplary CMOS image sensor according to the present invention.

FIG. 8 shows an exemplary layout for the unit pixels in the exemplary embodiment(s) discussed herein. The 2×2 pattern shown in FIG. 8 is simply repeated as often as is desired for a given chip design. By combining red (R) and blue (B) unit pixels in the same area, the density of the pixel array can be increased by up to about 20-25%.

As described above in detail, impurities are implanted into the semiconductor substrate with different ion implantation energies such that a first photodiode (e.g., for a red light-detecting pixel) and a second photodiode (e.g., for a blue light-detecting pixel) are longitudinally aligned with each other while representing a height difference, thereby improving there solution of the image.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating an image sensor, the method comprising the steps of:
   forming an isolation pattern in a semiconductor substrate;
   forming first and second photodiode regions at opposite sides of the isolation pattern;
   implanting impurities into the first photodiode region of the semiconductor substrate at an implantation depth configured to detect light of a first wavelength, there by forming a first photodiode;
   implanting impurities into the first photodiode region of the substrate above the first photodiode using a first mask completely covering the second photodiode region, at an implantation depth configured to detect light of a second wavelength shorter than the first wavelength, thereby forming a second photodiode in the first photodiode region;
   implanting impurities into the second photodiode region using a second mask completely covering the first photodiode region and exposing the second photodiode region, thereby forming a third photodiode in the second photodiode region;
   forming a plug in electrical contact with the first photodiode;
   forming transistor structures on the semiconductor substrate such that the transistor structures are electrically connected with the first, third and second photodiodes;
   forming an insulating layer covering the transistor structures; and
   forming microlenses on the insulating layer.

2. The method as claimed in claim 1, wherein forming the first photodiode comprises implanting ions at a first ion implantation energy, and forming the second photodiode comprises implanting ions at a second ion implantation energy lower than the first ion implantation energy.

3. The method as claimed in claim 1, further comprising forming a high density impurity region between the first photodiode and the second photodiode so as to prevent the first and second photodiodes from interfering with each other.

4. The method as claimed in claim 3, wherein the high density impurity region comprises a P-type ion, and the first and second photodiodes comprise an N-type ion.

5. The method of claim 1, wherein implanting impurities into the second photodiode region comprises implanting impurities at an implantation depth configured to detect light of a third wavelength longer than the second wavelength.

6. The method of claim 5, wherein the third wavelength is shorter than the first wavelength.

7. The method of claim 1, wherein the second photodiode is formed on or near the surface of the semiconductor substrate.

8. The method of claim 5, wherein the first, second and third wavelengths correspond to red, blue and green light, respectively.

9. The method of claim 5, wherein the first second and third wavelengths correspond to magenta, cyan and yellow light, respectively.

10. The method of claim 1, wherein the implantation depth configured to detect light of a first wavelength is between 0.7 μm and 1.5 μm from an upper surface of the semiconductor substrate.

11. The method of claim 1, wherein the implantation depth configured to detect light of a second wavelength is between 0.3 μm and 0.5 μm from an upper surface of the semiconductor substrate.

12. The method of claim 5, wherein the implantation depth configured to detect light of a third wavelength is between 0.5 μm and 1.5 μm from an upper surface of the semiconductor substrate.

13. The method of claim 1, wherein the plug comprises impurity ions.

14. The method of claim 13, wherein the plug comprises N-type ions.

15. The method of claim 14, wherein the plug comprises phosphorus, arsenic or antimony ions.

16. The method of claim 1, further comprising forming a color filter in the second photodiode region.

17. The method of claim 1, wherein the semiconductor substrate comprises an epitaxial layer.

18. The method of claim 17, wherein the second and third photodiodes are formed in the epitaxial layer.

* * * * *